(12) United States Patent
Meador et al.

(10) Patent No.: US 10,775,190 B2
(45) Date of Patent: *Sep. 15, 2020

(54) INTERACTIVE VIRTUAL REALITY TOUR

(71) Applicants: Pamala Meador, Morgan Hill, CA (US); Tony Meador, Morgan Hill, CA (US)

(72) Inventors: Pamala Meador, Morgan Hill, CA (US); Tony Meador, Morgan Hill, CA (US)

( * ) Notice: Subject to any disclaimer, the term of this patent is extended or adjusted under 35 U.S.C. 154(b) by 31 days.

This patent is subject to a terminal disclaimer.

(21) Appl. No.: 16/168,591

(22) Filed: Oct. 23, 2018

(65) Prior Publication Data
US 2019/0056236 A1  Feb. 21, 2019

Related U.S. Application Data

(63) Continuation of application No. 10/389,342, filed on Mar. 13, 2003, now Pat. No. 10,151,599.

(51) Int. Cl.
| | | |
|---|---|---|
| *G06F 3/048* | (2013.01) | |
| *G01C 21/36* | (2006.01) | |
| *G06Q 50/16* | (2012.01) | |
| *G06F 3/01* | (2006.01) | |
| *G06F 3/0484* | (2013.01) | |
| *G06F 30/13* | (2020.01) | |
| *G01C 21/20* | (2006.01) | |

(52) U.S. Cl.
CPC ............ *G01C 21/367* (2013.01); *G06F 3/011* (2013.01); *G06F 3/04845* (2013.01); *G06F 30/13* (2020.01); *G06Q 50/16* (2013.01); *G01C 21/206* (2013.01); *G06F 2203/04806* (2013.01)

(58) Field of Classification Search
CPC ........... G06F 3/04815; G06F 17/30241; G07F 17/32; G06T 19/003
See application file for complete search history.

(56) References Cited

U.S. PATENT DOCUMENTS

| | | | | |
|---|---|---|---|---|
| 5,808,614 | A * | 9/1998 | Nagahara | G06F 3/04815 715/776 |
| 5,999,944 | A * | 12/1999 | Lipkin | G06F 16/26 |
| 6,002,853 | A * | 12/1999 | de Hond | G06F 16/10 709/219 |
| 6,200,138 | B1 * | 3/2001 | Ando | A63F 13/10 434/61 |
| 6,337,688 | B1 * | 1/2002 | Berstis | A63F 13/10 345/473 |

(Continued)

*Primary Examiner* — Justin S Lee
(74) *Attorney, Agent, or Firm* — Haverstock & Owens LLP

(57) ABSTRACT

An interactive viewing system of the present invention provides a user with a viewing duality in which a user is shown a floor plan, schematic layout, or other diagram on one side of a display and a visual representation, such as a digital image, corresponding to a selected portion of the schematic layout or diagram, on the other side of the same display. The user is presented with a current position marker and a directional indicator as they navigate through the schematic layout. At designated positions within the schematic layout, a corresponding image is concurrently displayed. In this manner, the user maintains a sense of where they are within the entire structure, while at the same time seeing images of the corresponding area.

65 Claims, 8 Drawing Sheets

(56) References Cited

U.S. PATENT DOCUMENTS

| | | | | |
|---|---|---|---|---|
| 6,388,688 | B1 * | 5/2002 | Schileru-Key | G06F 3/04815 |
| | | | | 715/854 |
| 6,563,529 | B1 * | 5/2003 | Jongerius | G06F 3/04815 |
| | | | | 345/629 |
| 6,652,376 | B1 * | 11/2003 | Yoshida | A63F 13/10 |
| | | | | 463/6 |
| 6,907,579 | B2 * | 6/2005 | Chang | G06T 19/003 |
| | | | | 345/418 |
| 2001/0009418 | A1 * | 7/2001 | Hiroike | G06T 15/10 |
| | | | | 345/427 |
| 2001/0025261 | A1 * | 9/2001 | Olefson | H04L 29/06 |
| | | | | 705/313 |
| 2002/0070981 | A1 * | 6/2002 | Kida | G06F 16/29 |
| | | | | 715/833 |
| 2002/0152127 | A1 * | 10/2002 | Hamilton, II | G06Q 30/0643 |
| | | | | 705/27.2 |
| 2002/0178072 | A1 * | 11/2002 | Gusler | G06Q 30/06 |
| | | | | 705/26.1 |
| 2004/0125121 | A1 * | 7/2004 | Pea | G11B 27/034 |
| | | | | 715/716 |

* cited by examiner

INTERACTIVE VIRTUAL REALITY TOUR

RELATED APPLICATIONS

This application is a continuation of U.S. patent application Ser. No. 10/389,342, filed on Mar. 13, 2003, and entitled "INTERACTIVE VIRTUAL REALITY TOUR" which is hereby incorporated by reference.

FIELD OF THE INVENTION

The present invention relates to the field of systems for providing virtual reality tours of remote locations. More particularly, the present invention relates to the field of systems for providing interactive virtual reality tours of real or imaginary locations.

BACKGROUND OF THE INVENTION

The World Wide Web (also known as and hereinafter referred to as the "Internet") is a rapidly expanding network of computers which provides users with numerous services and a wealth of information. The internet is primarily a visually based system, allowing a user to graphically interact with an image or series of images on a display screen. Users are able to locate updated information regarding weather, stock prices, news and many other topics.

Using the visual capabilities of computers and the internet, users are able to bring distant locations to them through the use of virtual reality tours. One use of such tours is in the real estate industry. Virtual reality tours are created for properties which are for sale or rent. Users interested in viewing the home can take the virtual reality tour before deciding to take the time to visit the home in person. The virtual reality tour is typically created by taking pictures or video of each room, or selected views from within or outside of the home.

Different types of virtual reality tours have been developed. An iPix™ virtual tour is created by setting a camera with an extreme fisheye lens in the middle of a room, and then rotating the lens. The end result is stitched together into a seamless image that gives the user a sense of the room in 360 degrees, also referred to as panoramic. Additionally, the tour may show a floor plan of the home with small thumbnail photographs pointing to sections of interest. The user must click on these thumbnails, which drills down to a second page with a close-up of the thumbnail and a description of the related section. The close-up must then be clicked to load the 360 degree, panoramic view. This functionality requires the user to drill down two pages to view the result. Further, there is minimal user interactivity or sense of layout or depth, and the tour usually requires a special software plug-in to be downloaded by the user.

Iseemedia™ provides a virtual reality tour similar to iPix™ with the ability to zoom in to the 360 degree rotating picture, as well as the ability to move the viewpoint up or down. Plurotech™ provides another 360 degree view and requires QuickTime™ technology, which maps two-dimensional objects to a three-dimensional grid. This yields quicker loading times and uses a more popular plug-in for the browser.

Seeitbuyit.com™ provides a slide show of rooms with start and stop capability. 360 degree view is also available, but must be downloaded separately, and is functional while using the slide show. EyeCron™ also provides a slide show presentation of photographs, which requires uploading of presentation software. Using the presentation software, users are presented with a series of photographs and music.

DeedChek.com™ provides software to create property layouts and boundaries, as well as the ability to create subdivisions of property. However, no photographs of the property are provided.

Video game 3D mapping provides users with detailed animated three-dimensional representations. Video game 3D mapping tools are quite complex and require the creation of individual objects which are then combined as building blocks to produce the 3D modeling. CAD (computer-aided design) architectural modeling typically uses a graphics tablet for drawing architectural designs. CAD systems can be quite complex, where the more complex forms of CAD used for solid modeling and parametric modeling. Neither the video game 3D mapping tools nor the CAD architectural modeling tools provide the ability to juxtapose a floor plan layout and images corresponding to specific portions of the floor plan layout. Additionally, both of these types of modeling tools may be too complex for many applications.

Blogmapper.com™ provides a conventional map and a series of dots which are placed on the map showing points of interest. When the dot is clicked, a series of photographs appear in the right hand margin of the screen. However, the map does not give the user a sense of where they are in relation to the displayed photograph. As the dot is selected, there is no change in the map to indicate a selection has been made or to correlate the selected dot with the corresponding photograph. Neither is there any indication regarding a viewer's angle of perspective, that is in what direction the viewer is looking.

Current visual reality tours do not give the user a feeling of depth from where the photographs are taking place, nor a sense of awareness of the surrounding property itself. The tours are presented as either a rotating fisheye view, or a series of photographs presented as a slide show. Many of the existing tours also require a high bandwidth connection via the internet, as well as specific plug-ins to work with the internet browser. If a user were to use a dial-up connection, download times may prove prohibitive, or at the least inconvenient.

SUMMARY OF THE INVENTION

An interactive viewing system of the present invention provides a user with a viewing duality in which a user is shown a floor plan, schematic layout, or other diagram on one side of a display and a visual representation, such as a digital image, corresponding to a selected portion of the schematic layout or diagram, on the other side of the same display. The visual representation can also be a video or any other type of graphic or audio content. The user is presented with a current position marker and preferably a directional indicator as they navigate through the schematic layout. The schematic layout preferably includes a pathway to indicate suggested movement. At designated positions within the schematic layout, a corresponding image is concurrently displayed. As the image is displayed on one portion of the display, a portion of the schematic layout corresponding to the image is highlighted, and the current position marker includes a direction indicator. In this manner, the user better correlates the image with it's location within the schematic layout. In this manner, the user maintains a sense of where they are within the entire structure, while at the same time seeing images of the corresponding area.

In an aspect of the present invention, a method of electronically viewing a remote location includes navigating a schematic layout, wherein a current position within the schematic layout is represented by a current position marker, and the schematic layout represents a physical location, and viewing a visual representation of a portion of the schematic layout corresponding to the current position marker, wherein the schematic layout and the visual representation are concurrently viewed. The current position marker can represent a position from which the visual representation is made, and can further comprise a directional indicator which indicates a perspective angle of the visual representation. A portion of the schematic layout corresponding to the visual representation can be highlighted. The current position marker can represent a position to which the visual representation is made and can further comprise a directional indicator which indicates a perspective angle from which the visual representation is made. The physical location can be real or imaginary. The schematic layout and the visual representation can be viewed side-by-side. Navigating the schematic layout can be accomplished by following a suggested movement along a pathway within the schematic layout. The schematic layout can comprise one or more levels. Each level can be a two-dimensional representation. Each level can be a three-dimensional representation. One level can be displayed on the schematic layout at a time. Each level can be transparent, semi-transparent, or opaque. More than one level can be displayed on the schematic layout at the same time. The schematic layout can be navigated using a user interface which includes a keyboard, a mouse, or a touch-sensitive display. The visual representation can be an image, video, or graphic content. The visual representation can be a digital photograph. Flash technology can be used to display the schematic layout and the visual representation. The physical location can represent an object or an environment. The current position marker can include a means for indicating additional functionality. The additional functionality can include a link to a related schematic layout or a link to a related visual representation. The additional functionality can include a link to an interactive visual representation.

In another aspect of the present invention, an apparatus for providing an interactive tour includes a user interface to navigate a schematic layout, wherein a current position within the schematic layout is represented by a current position marker, and the schematic layout represents a physical location, and a display device coupled to the user interface to display the schematic layout and a visual representation of a portion of the schematic layout corresponding to the current position marker, wherein the schematic layout and the visual representation are concurrently viewed. The current position marker can represent a position from which the visual representation is made, and can further comprise a directional indicator which indicates a perspective angle of the visual representation. A portion of the schematic layout corresponding to the visual representation can be highlighted. The current position marker can represent a position to which the visual representation is made and can further comprise a directional indicator which indicates a perspective angle from which the visual representation is made. The physical location can be real or imaginary. The schematic layout and the visual representation can be viewed side-by-side. The schematic layout can further comprise a pathway to provide a suggested movement while navigating the schematic layout. The schematic layout can comprise one or more levels. Each level can be a two-dimensional representation. Each level can be a three-dimensional representation. One level can be displayed on the schematic layout at a time. Each level can be transparent, semi-transparent, or opaque. More than one level can be displayed on the schematic layout at the same time. The user interface can include a keyboard, a mouse, or a touch-sensitive display. The visual representation can be an image, video, or graphic content. The visual representation can be a digital photograph. Flash technology can be used to display the schematic layout and the visual representation. The physical location can represent an object or an environment. The current position marker can include a means for indicating additional functionality. The additional functionality can include a link to a related schematic layout or a link to a related visual representation. The additional functionality can include a link to an interactive visual representation.

In yet another aspect of the present invention, a network of devices to provide an interactive tour includes one or more computer systems configured to communicate with other systems, and an interactive viewing system configured to couple to the one or more computer systems to navigate a schematic layout, wherein a current position within the schematic layout is represented by a current position marker, and the schematic layout represents a physical location, and to display the schematic layout and a visual representation of a portion of the schematic layout corresponding to the current position marker, wherein the schematic layout and the visual representation are concurrently viewed. The current position marker can represent a position from which the visual representation is made, and can further comprise a directional indicator which indicates a perspective angle of the visual representation. A portion of the schematic layout corresponding to the visual representation can be highlighted. The current position marker can represent a position to which the visual representation is made and can further comprise a directional indicator which indicates a perspective angle from which the visual representation is made. The physical location can be real or imaginary. The schematic layout and the visual representation can be viewed side-by-side. The schematic layout can further comprise a pathway to provide a suggested movement while navigating the schematic layout. The schematic layout can comprise one or more levels. Each level can be a two-dimensional representation. Each level can be a three-dimensional representation. One level can be displayed on the schematic layout at a time. Each level can be transparent, semi-transparent, or opaque. More than one level can be displayed on the schematic layout at the same time. The user interface can include a keyboard, a mouse, or a touch-sensitive display. The visual representation can be an image, video, or graphic content. The visual representation can be a digital photograph. Flash technology can be used to display the schematic layout and the visual representation. The one or more computer systems and the interactive viewing system can be coupled via the Internet. The interactive viewing system can reside within a personal computer, a personal digital assistant (PDA), or a cellular phone. The physical location can represent an object or an environment. The current position marker can include a means for indicating additional functionality. The additional functionality can include a link to a related schematic layout or a link to a related visual representation. The additional functionality can include a link to an interactive visual representation.

In another aspect of the present invention, a method of generating an interactive tour includes generating a preliminary schematic layout, wherein the preliminary schematic layout represents a physical location, uploading one or more visual representations to be associated with a completed schematic layout, wherein a user navigates the completed schematic layout during the interactive tour, and associating each visual representation to a specific portion of the preliminary schematic layout, thereby forming the completed schematic layout, wherein as the user navigates the completed schematic layout, the completed schematic layout and the visual representation corresponding to a current position within the completed schematic layout are concurrently displayed. The method can further comprise associating a description with each visual representation. The method can further comprise adding a current position marker corresponding to the current position, wherein the current position marker comprises a directional indicator which indicates a perspective angle of the visual representation. The method can further comprise highlighting the portion of the schematic layout corresponding to the visual representation currently displayed. The physical location can be real or imaginary. The schematic layout and the visual representation can be viewed side-by-side. The method can further comprise adding a pathway to the schematic layout wherein the pathway provides the user with a suggested movement within the schematic layout. The schematic layout can comprise one or more levels. Each level can be a two-dimensional representation. Each level can be a three-dimensional representation. One level can be displayed on the schematic layout at a time. Each level can be transparent, semi-transparent, or opaque. More than one level can be displayed on the schematic layout at the same time. The completed schematic layout can be navigated using a user interface which includes a keyboard, a mouse, or a touch-sensitive display. The visual representation can be an image, video, or graphic content. The visual representation can be a digital photograph. Flash technology can be used to display the schematic layout and the visual representation. The method can further comprise concurrently displaying the preliminary schematic layout and a menu of the uploaded visual representation. The menu of visual representations can be a visual menu comprising reduced-scale visual representations of each uploaded visual representation. The physical location can represent an object or an environment. The current position marker can include a means for indicating additional functionality. The additional functionality can include a link to a related schematic layout or a link to a related visual representation. The additional functionality can include a link to an interactive visual representation.

DETAILED DESCRIPTION OF THE PREFERRED EMBODIMENT

An interactive viewing system of the present invention provides a user with a viewing duality in which a user is shown a floor plan, schematic layout, or other diagram on one side of a display and a visual representation, such as a digital image, corresponding to a selected portion of the schematic layout or diagram, on the other side of the same display. The user is preferably presented with a current position marker and a directional indicator as they navigate through the schematic layout. At designated positions within the schematic layout, a corresponding image is concurrently displayed. In this manner, the user maintains a sense of where they are within the entire structure, while at the same time seeing images of the corresponding area.

Figure 1:
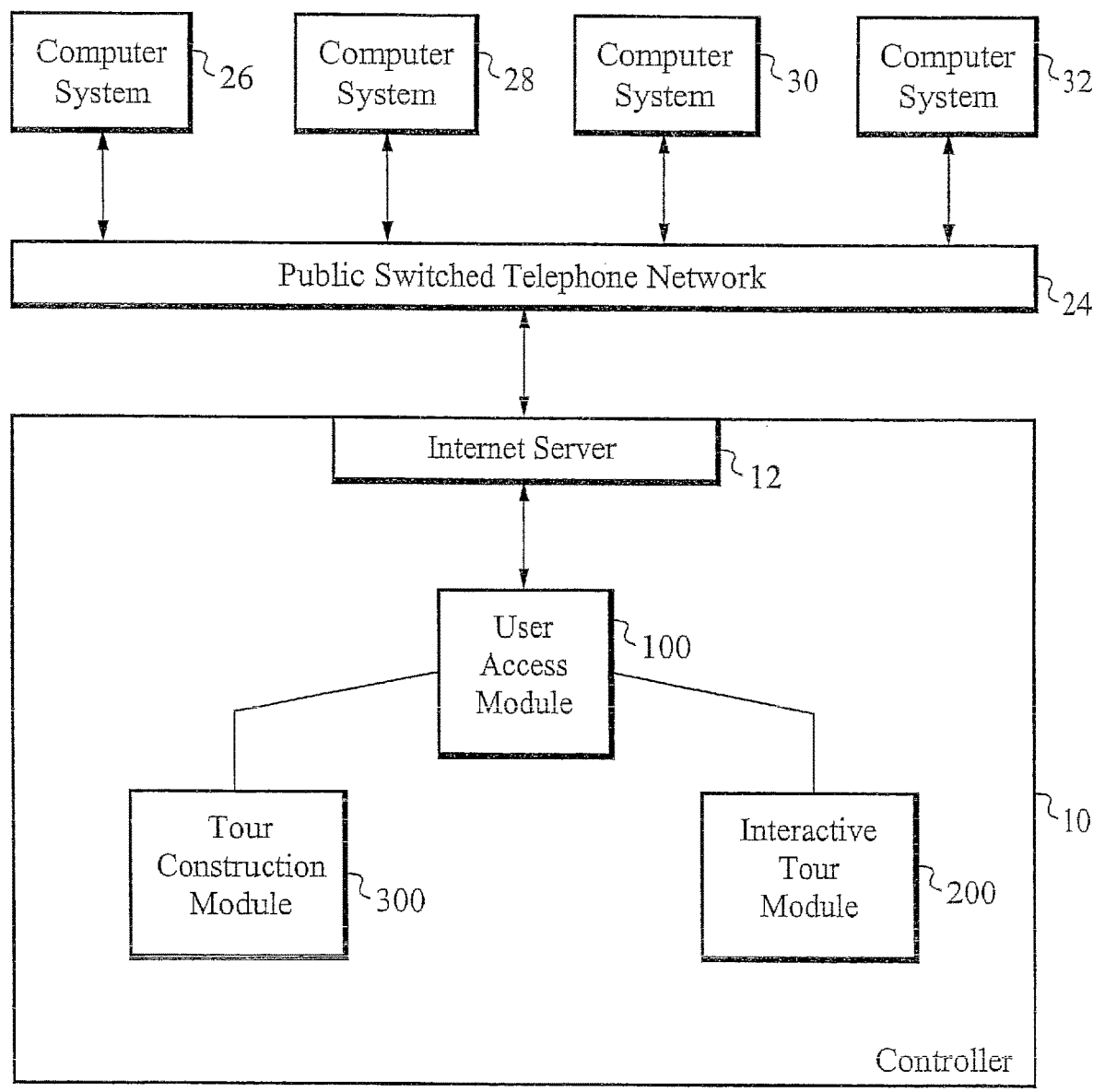
FIG. 1 illustrates a block diagram of an interactive viewing system according to the preferred embodiment of the present invention.

A block diagram of an interactive viewing system for providing a virtual reality interactive tour according to the preferred embodiment of the present invention is illustrated in FIG. 1. A controller 10 includes an internet server 12, a user access module 100, an interactive tour module 200, and a tour construction module 300. The user access module 100 is coupled to the interactive tour module 200 and the tour construction module 300 to control communications between the controller 10 and users accessing the interactive viewing system. The tour construction module 300 is used to construct a new interactive tour. The interactive tour module 200 is used to view and navigate any existing interactive tour. As used herein, the term user includes one or more of an individual, group of individuals, association, corporation, agency, or any other person or entity accessing the interactive viewing system to create and select interactive tours. Preferably, the user is any entity interested in generating or viewing an interactive tour representative of a specific physical location, but it should be clear that any user is capable of using the system.

The controller 10 is coupled to the public switched telephone network 24 to allow communications between the internet server 12 and the users' computer systems 26-32. Using the computer systems 26-32, users have the ability to establish a connection with the user access module 200 to create new interactive tours and to engage existing interactive tours. Preferably, this connection is established between the users' computer systems 26-32 and the controller 10 over the internet through the public switched telephone network 24. Alternatively, this connection is established by any appropriate connection including a direct connection over the public switched telephone network 24. It should be clear to those skilled in the art that the interactive viewing system of the present invention can also be used as a stand alone system in which the controller 10 can be integrated within a computer system such as the computer systems 26-32.

Figure 2:
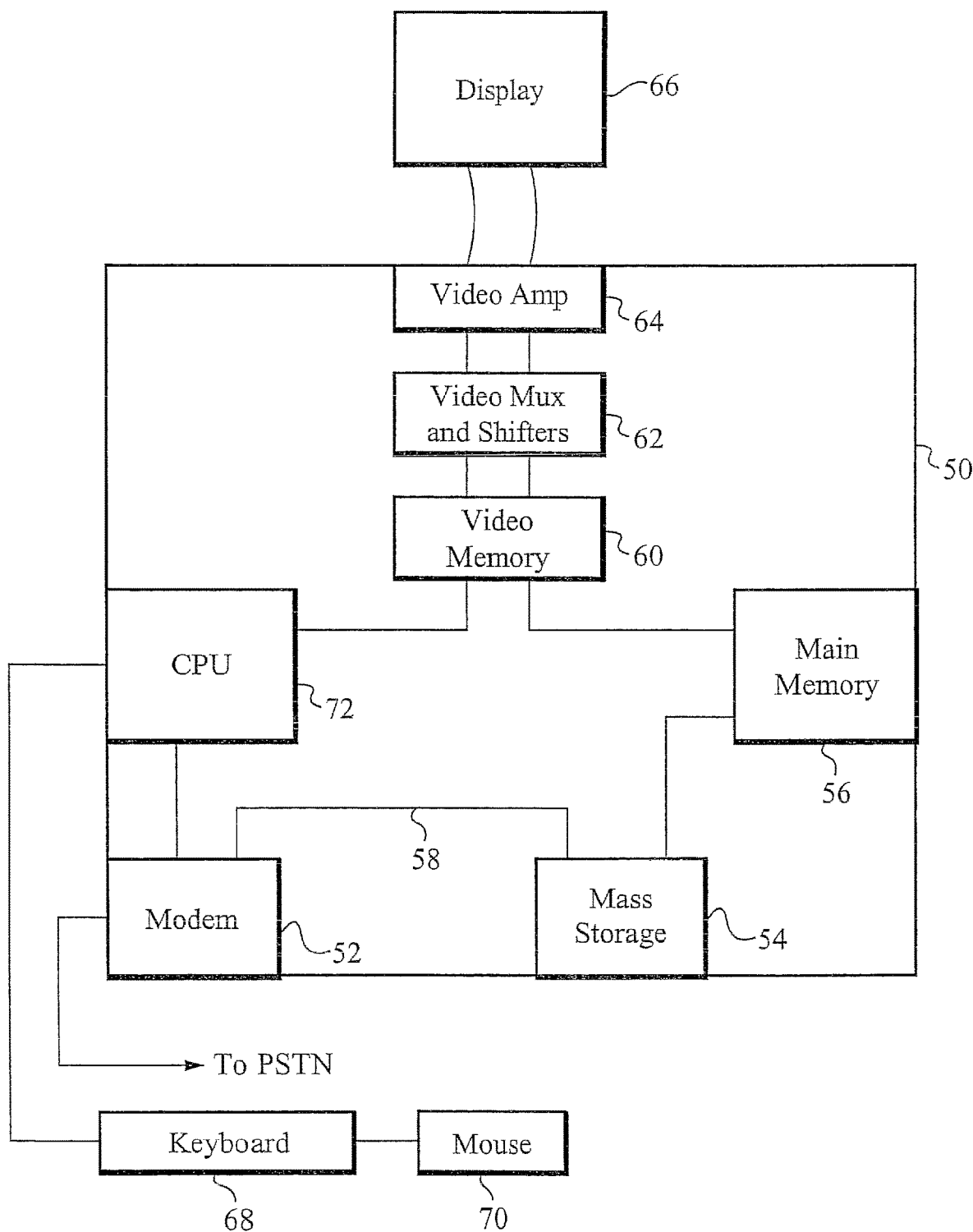
FIG. 2 illustrates a block diagram of the internal components of the computer systems used to access the interactive viewing controller of the preferred embodiment of the present invention.

A block diagram of the internal components of the computer systems 26-32 used by users to access the controller 10 of the present invention is illustrated in FIG. 2. While the controller 10 can be accessed from any appropriately configured computer system or internet access device, an exemplary computer system 50 for accessing the controller 10 is illustrated in FIG. 2. The exemplary computer system 50 includes a CPU 72, a main memory 56, a video memory 60, a mass storage device 54 and a modem 52, all coupled together by a conventional bidirectional system bus 58. The modem 52 is preferably coupled to the public switched telephone network 24 for sending and receiving communications. The mass storage device 54 may include both fixed and removable media using any one or more of magnetic, optical or magneto-optical storage technology or any other available mass storage technology. The system bus 58 contains an address bus for addressing any portion of the memory 54, 56 and 60. The system bus 58 also includes a data bus for transferring data between and among the CPU 72, the main memory 56, the video memory 60, the mass storage device 54 and the modem 52.

The computer system 50 is also coupled to a number of peripheral input and output devices including the keyboard 68, the mouse 70, and the associated display 66. The keyboard 68 is coupled to the CPU 72 for allowing a user to input data and control commands into the computer system 50. A conventional mouse 70 is coupled to the keyboard 68 or computer system 50, directly, for manipulating graphic images on the display 66 as a cursor control device in a conventional manner. The display 66 displays video and graphical images generated by the computer system 50. The display 66 can be of any conventional type, including but not limited to a view-only device and a touch sensitive display.

A port of the video memory 60 is coupled to a video multiplex and shifter circuit 62, which in turn is coupled to a video amplifier 64. The video amplifier 64 drives the display 66, when it is being used. The video multiplex and shifter circuitry 62 and the video amplifier 64 convert pixel data stored in the video memory 60 to raster signals suitable for use by the display 66.

Figure 3:
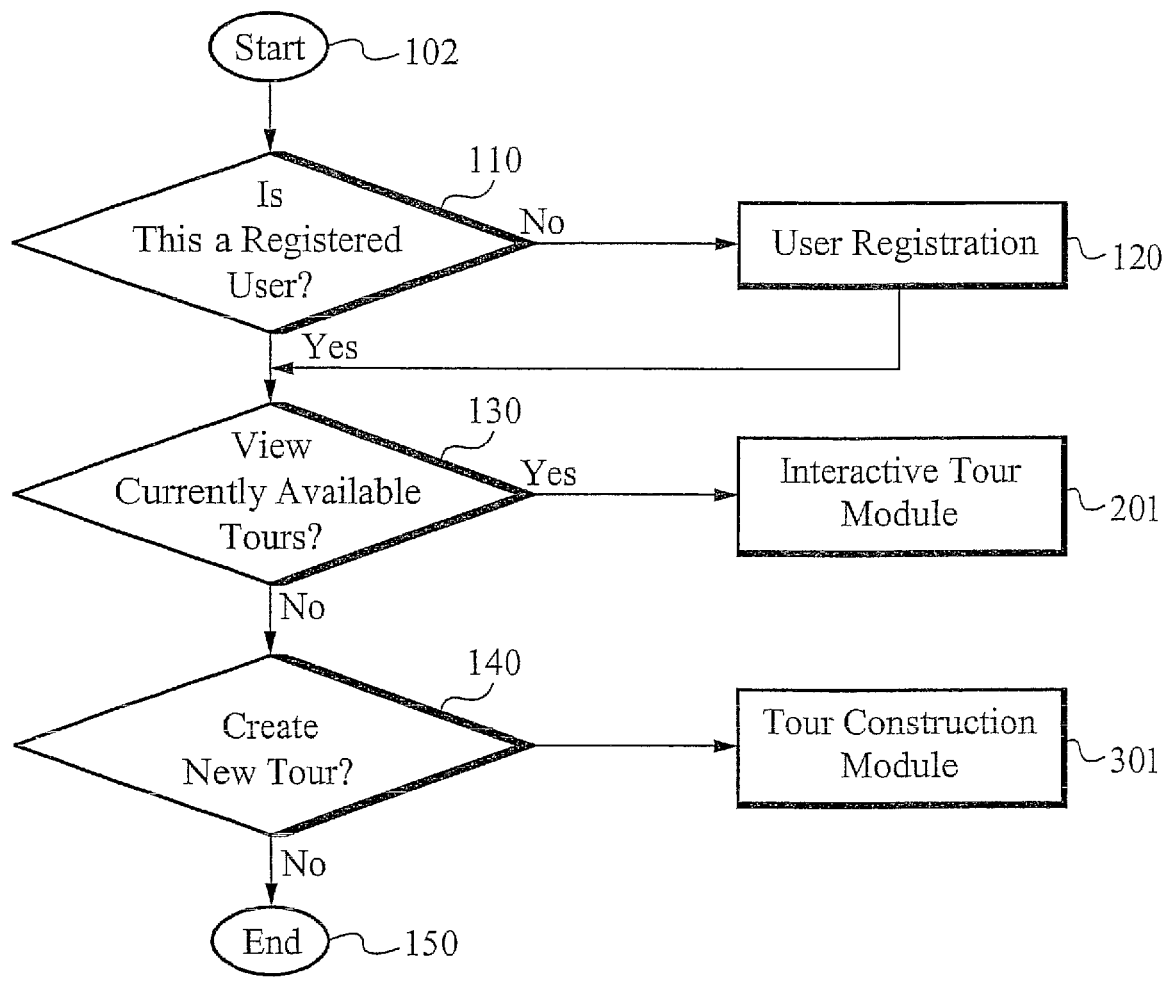
FIG. 3 illustrates a flowchart showing the process used when a user accesses the user access module.

A flowchart illustrating the process used when a user accesses the user access module 100 is illustrated in FIG. 3. The process of FIG. 3 starts at the step 102. At the step 110 it is determined if the user currently accessing the user access module 100 is registered with the user access module 100. If the user is not yet registered with the user access module 100, then the user is registered at the step 120 by entering registration information such as name, address, telephone numbers, and email address. Once the user is registered with the user access module 100, then it is determined at the step 130 if the user would like to view the available interactive tours. If it is determined at the step 130 that the user does want to view the available interactive tours, then at the step 201, the process jumps to the interactive tour process illustrated in FIG. 4, which will be described below. If it is determined at the step 130 that the user does not want to view the available interactive tours, then it is determined at the step 140 if the user would like to create a new interactive tour. If it is determined that the user would like to create a new interactive tour, then at the step 301, the process jumps to the tour construction process illustrated in FIG. 6, which will be described below. If it is determined at the step 140 that the user does not want to create a new interactive tour, then the user access module process ends at the step 150.

Figure 4:
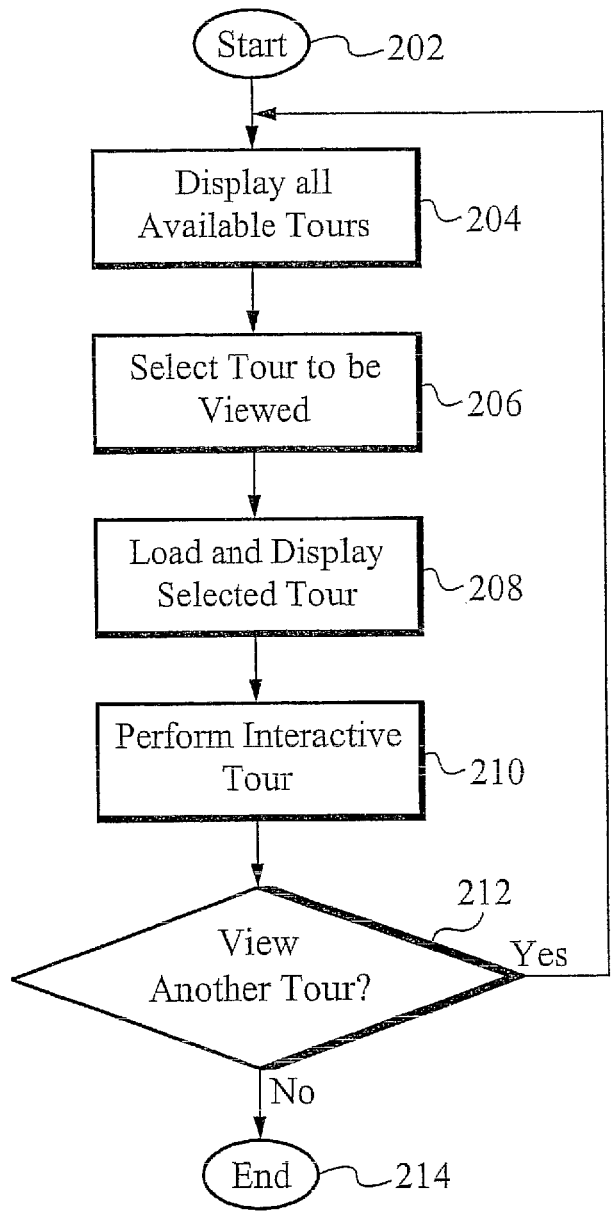
FIG. 4 illustrates a flowchart showing the interactive tour process of the present invention.

A flowchart illustrating the interactive tour process of the present invention is illustrated in FIG. 4. The interactive tour model includes all previously constructed interactive tours which are available for use. The interactive tour process starts at the step 202. At the step 204, a list of all available interactive tours is displayed. At the step 206, the user selects the desired interactive tour to be run, and at the step 208, the selected interactive tour is loaded and the starting point of the tour is displayed. At the step 210, the user navigates the interactive tour. Preferably, the interactive tour is a self-paced program which enables the user to progress through the tour at their own pace. As will be described below in greater detail, the user progresses through the tour by controlling an on-screen cursor using a mouse, keyboard, touch sensitive display screen, or any other conventional means for moving a cursor within a graphical user interface (GUI). At the step 212, it is determined if the user wants to run another interactive tour. If it is determined at the step 212 that the user does want to view another interactive tour, then the process jumps back to the step 204, where the list of all available interactive tours is displayed. If it is determined at the step 212 that the user does not want to view another interactive tour, then the interactive tour module process ends at the step 214.

Figure 5:
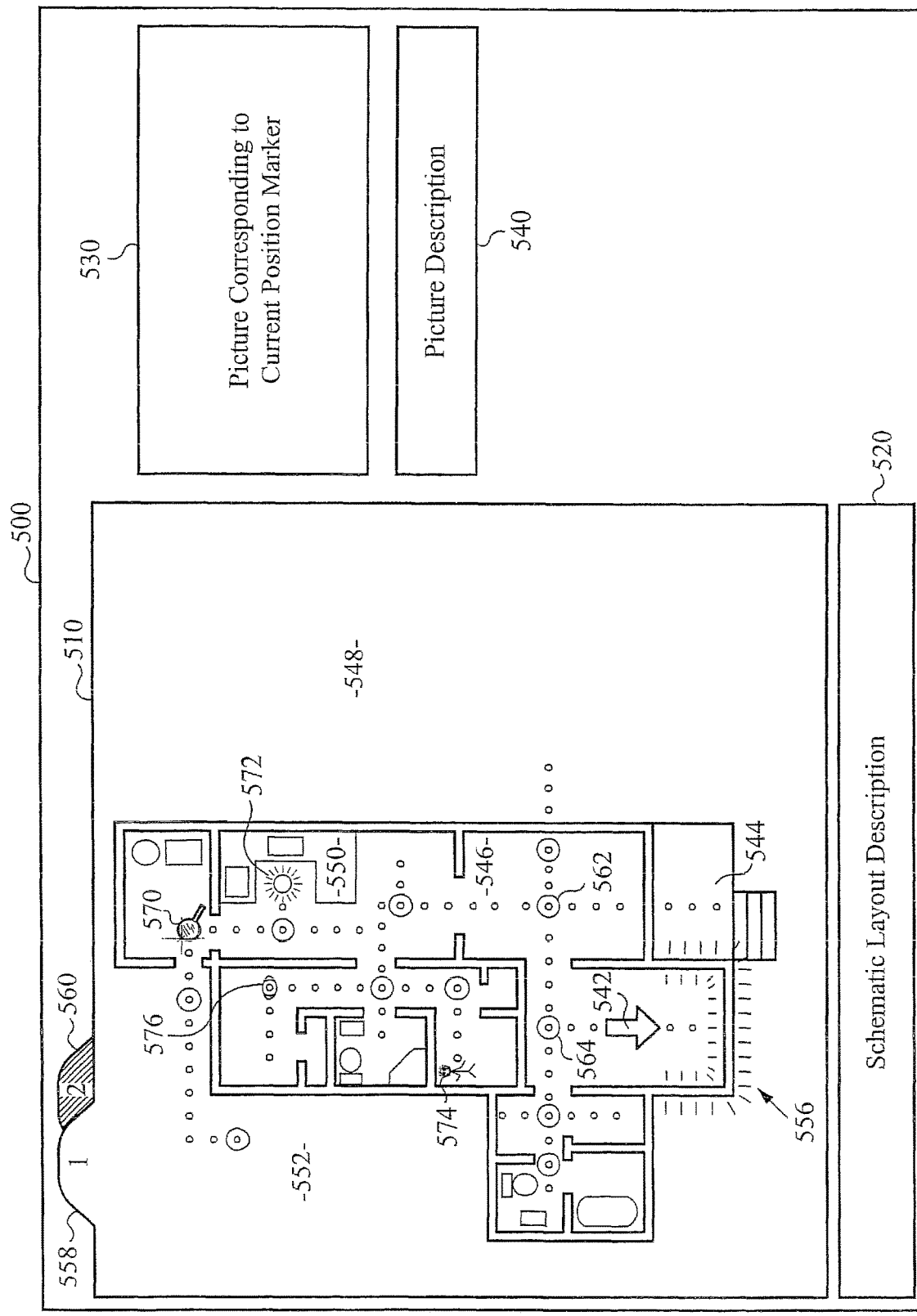
FIG. 5 illustrates an interactive tour GUI according to the preferred embodiment of the present invention.

The interactive viewing system used to provide an interactive tour includes an interactive tour GUI. An interactive tour GUI according to the preferred embodiment of the present invention is illustrated in FIG. 5. The interactive tour GUI 500 includes a schematic layout 510, a schematic layout description 520, a visual representation 530, and a visual representation description 540. The interactive tour GUI 500 illustrated in FIG. 5 corresponds to a home, and the schematic layout 510 preferably includes a top-down floor plan of the house and surrounding property. It should be clear to those skilled in the art that the interactive tour GUI illustrated in FIG. 5 is for illustrative purposes only and should not limit the scope of the interactive tour's subject matter. While it is preferred that the floor plan is to scale, it is not required. The schematic layout 510 preferably illustrates a single level of the home. Where multiple levels are necessary, additional levels can be constructed, each accessible by a tab such as tab 558 and tab 560. In FIG. 5, tab 558 corresponds to the first floor layout of the house. The layout corresponding to tab 560 is preferably not shown as schematic layout 510 corresponding to tab 558 covers the schematic layout corresponding to tab 560. Alternatively, the schematic layout 510 can utilize an "onion-skin" functionality where the schematic layout 510 is semi-transparent thereby enabling the schematic layout corresponding to tab 560 to be faintly seen, as if looking through tracing paper. In this manner, each level's relative position can be observed. In another alternative embodiment, multiple floor plans can be displayed on a single schematic layout 510.

The home schematic layout 510 provides a floor plan of the entire house including a front door and entryway 544, a living room 546, a kitchen 550, as well as the outside property including a front yard 548 and a back yard 552. The schematic layout 510 preferably includes a pathway 554 which provides a suggested path through the house. The pathway 554 can be navigated using the arrows of the keyboard. The user can also jump directly to any portion of the schematic layout 510 by moving the cursor to the desired portion using a mouse, or touching the display screen on the desired portion in the case of a touch sensitive display. Particular locations on the pathway 554 are designated as viewpoints, such as viewpoint 562 and 564, from which a visual representation 530 corresponding to that viewpoint is available. The visual representation 530 is preferably an image. Alternatively, the visual representation is a video, or any other conventional visual content. As the user navigates along the pathway 554, a current position marker 542 moves along the pathway 554. Preferably, the portion of the pathway 554 currently occupied by the current position marker 542 is highlighted to more easily identify the current position within the schematic layout 510. The current position marker 542 preferably includes a direction indicator to identify the perspective angle of the corresponding image shown in the visual representation 530. The direction indicator can be of any conventional type including, but not limited to an arrow 542, an eye-view 576 showing a field of view, or a user position 574 showing a field of view. The portion of the schematic layout 510 corresponding to the image in the visual representation 530 is highlighted as highlighted layout 556. In this preferred case, the current position marker 542 indicates the position and the direction from where the corresponding visual representation 530 is made, and the highlighted layout 556 indicates the image taken from the current position marker 542. It is understood that the current position marker can also represent different perspectives. For example, the current position marker 542 can indicate the position of the actual image that is displayed in the visual representation 530.

There is no limit to the number of viewpoints that can be included within the schematic layout 510. Multiple images can also be represented be a single viewpoint. For example, a single viewpoint can be located in the middle of a room and there can be four different images, one for each wall of the room that can be viewed while the current position marker 542 is located at this viewpoint. The direction indicator of the current position marker 542 can indicate which of the four pictures is currently shown in the visual representation 530.

Specific designated positions within the schematic layout can also provide links to additional information or functionality. When a user's current position corresponds to one such designated position, the user can link to a related schematic layout, such as a designated position corresponding to a staircase which provides a link to a second floor schematic layout. The user can also link to a more detailed schematic layout or visual representation, such as a designated position corresponding to a kitchen which provides a link to a more detailed kitchen schematic layout or a link to a more detailed visual representation of the kitchen, which can be one or more images. The user can also link to an interactive visual representation which enables the user to leave the schematic layout and move to the interactive visual representation where the user can then rotate the visual representation from side-to-side and/or up-and-down. It is understood that other methods of interacting with the visual representation are also available. It is also understood that additional functions can be linked to specific designated positions.

Designated positions that include such additional functionality can be identified to the user when the user arrives at such a designated position. Identification means can include a graphic means or a specific sound. Exemplary graphic means include highlighting the appropriate designated position in the schematic layout such as position 572 in FIG. 5, highlighting the designated position with a specific color, providing a designated symbol such as magnifying lens 570, or providing a pop-up text box. Either by graphic means or sound means, such an identification signals to the user that additional information or functionality is available. When a particular sound or graphic means occurs, the user is aware that they can leave the schematic layout area and move to the visual representation area to navigate. The visual representation in the visual representation area may change when this type of user navigation is made available. At this point, the visual representation can be drilled down into for more details, or the schematic layout may change for further detailed information or additional navigation.

The schematic layout description 520 includes a description of the schematic layout 510. The picture description 540 includes a description of the visual representation 530. Preferably, these are text descriptions.

In operation, a user selects an interactive tour from a list of available tours. The opening display on the interactive tour GUI includes a schematic layout on one side of the screen and a visual representation showing a location overview on the other side of the screen. In the case where the interactive tour corresponds to a house, the schematic layout can be a floor plan of the house and the first visual representation can be a picture of the front of the house taken from the street. Using a user interface, such as a mouse, the user then navigates through the schematic layout. A current position marker indicates the user's current position within the schematic layout. Preferably, the current position marker is highlighted and is in the shape of a directional indicator, such as an arrow. The schematic layout preferably includes a pathway which indicates suggested movements. Along the pathways are viewpoints which indicate positions within the schematic layout that include corresponding images to be displayed. As the user navigates along the pathways, from viewpoint to viewpoint, a corresponding image is displayed on the opposite side of the screen. The direction of the direction indicator indicates the viewing perspective of the image currently displayed. Accompanying each image is an associated description. If the interactive tour includes multiple levels, as in the case of a two-story house, the schematic layer can also include a staircase, which when selected, links the user to an adjoining level. The adjoining level can be navigated in a similar manner.

Figure 6:
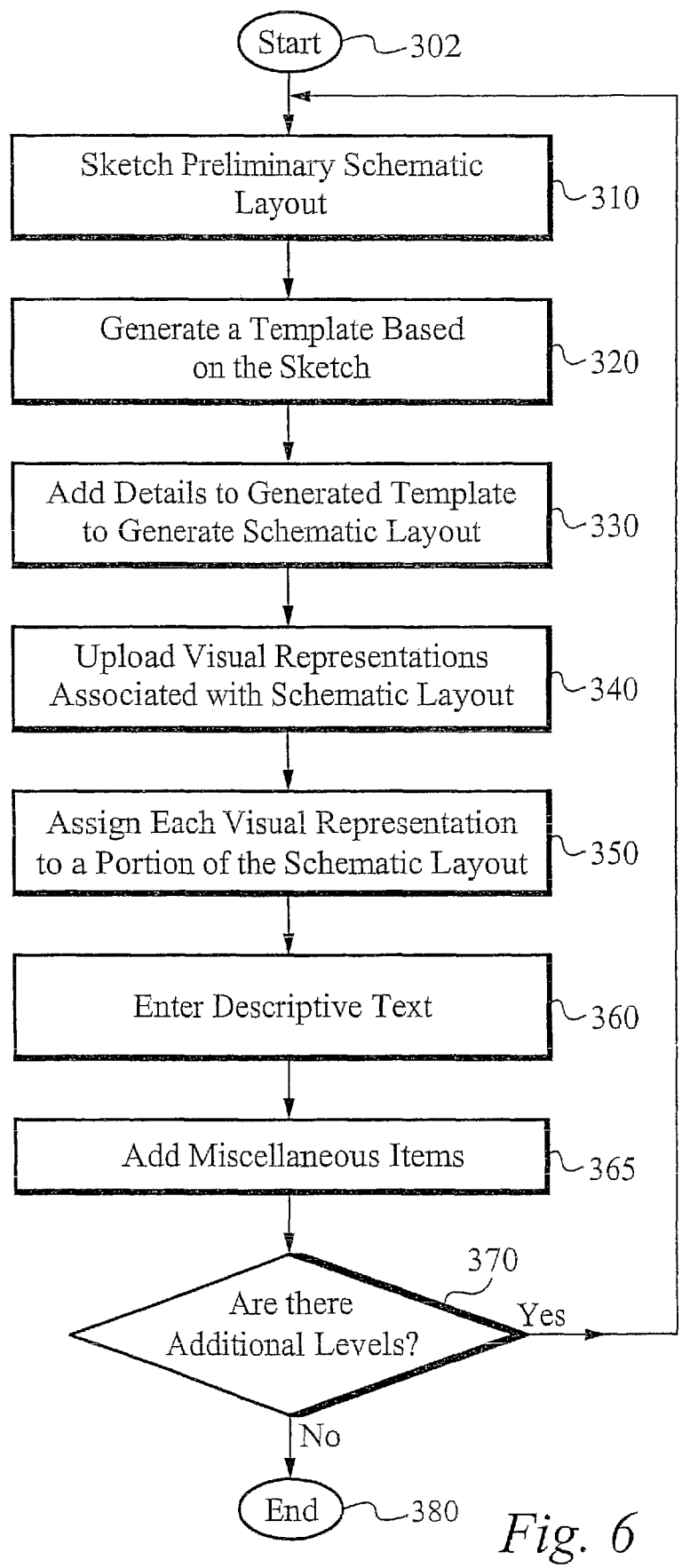
FIG. 6 illustrates a flowchart showing the tour construction process of the present invention

A flowchart illustrating the tour construction process of the present invention is illustrated in FIG. 6. The tour construction process starts at the step 302. At the step 310, a preliminary schematic layout is sketched by the user which provides a general layout of a physical location. A strictly accurate scale is not necessary. The sketch is preferably scanned and imported into the interactive viewing system. It is understood that any conventional means can be used to generate a preliminary schematic layout including, but not limited to, drawing the layout by hand and then scanning the drawing, or using any conventional drawing software and then importing the drawing from the drawing software to the interactive viewing system of the present invention. At the step 320, the imported preliminary schematic layout is converted to a template for use within the interactive viewing system. Alternatively, the user generates a preliminary schematic layout using a specially designed grid and notation template within the interactive viewing system. Using the grid, the user generates the template directly, essentially combining the steps 310 and 320 into a single step.

At the step 330, details are added to the generated template to generate a schematic layout for use in the interactive tour. Details to be added include, but are not limited to, refining the scale, specifying the location of windows, and adding room-specific symbols such as toilets, sinks, showers, bathtubs, kitchen appliances, utilities, and outside yard features.

At the step 340, visual representations are uploaded and associated with the schematic layout. Preferably, the visual representations are images taken from a digital camera. Alternatively, the visual representations can be any type of image, video or graphic content. At the step 350, each visual representation is assigned to a portion of the schematic layout. At the step 360, a description of each visual representation is entered. Preferably, the description is a text description. Descriptions associated with the schematic layout and the overall interactive tour can also be entered. At the step 365, additional items, such as partner links or advertisements, are added. The additional items can be added directly or through dynamic links to specific items. At the step 370, it is determined if there is an additional level of the schematic layout to be generated. If it is determined at the step 370 that there is an additional level to be generated, then the process jumps to the step 310. If it is determined at the step 370 that there is not an additional level to be generated, then the tour construction process ends at the step 380.

Figure 7:
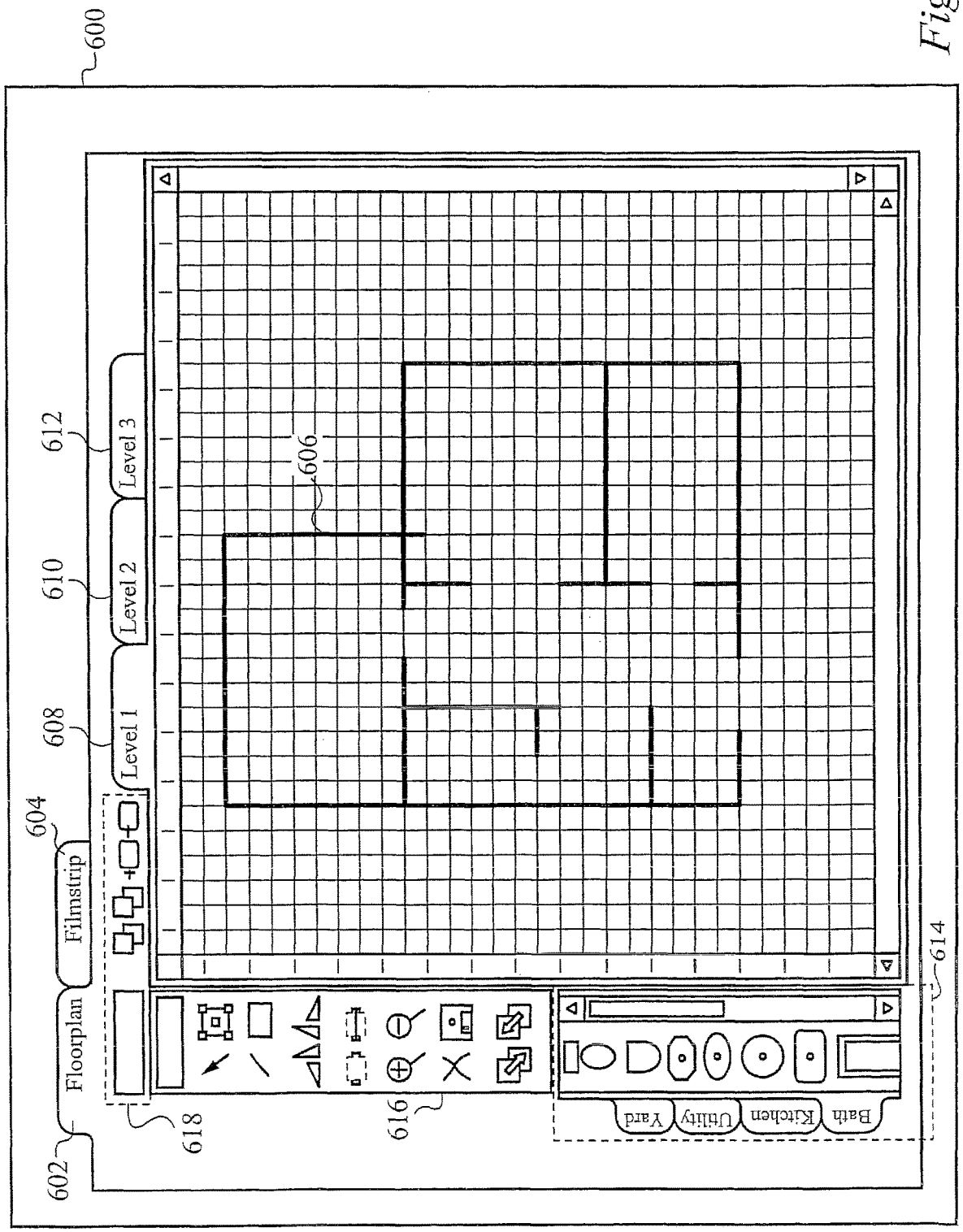
FIG. 7 illustrates a first screen of an tour construction GUI.
Figure 8:
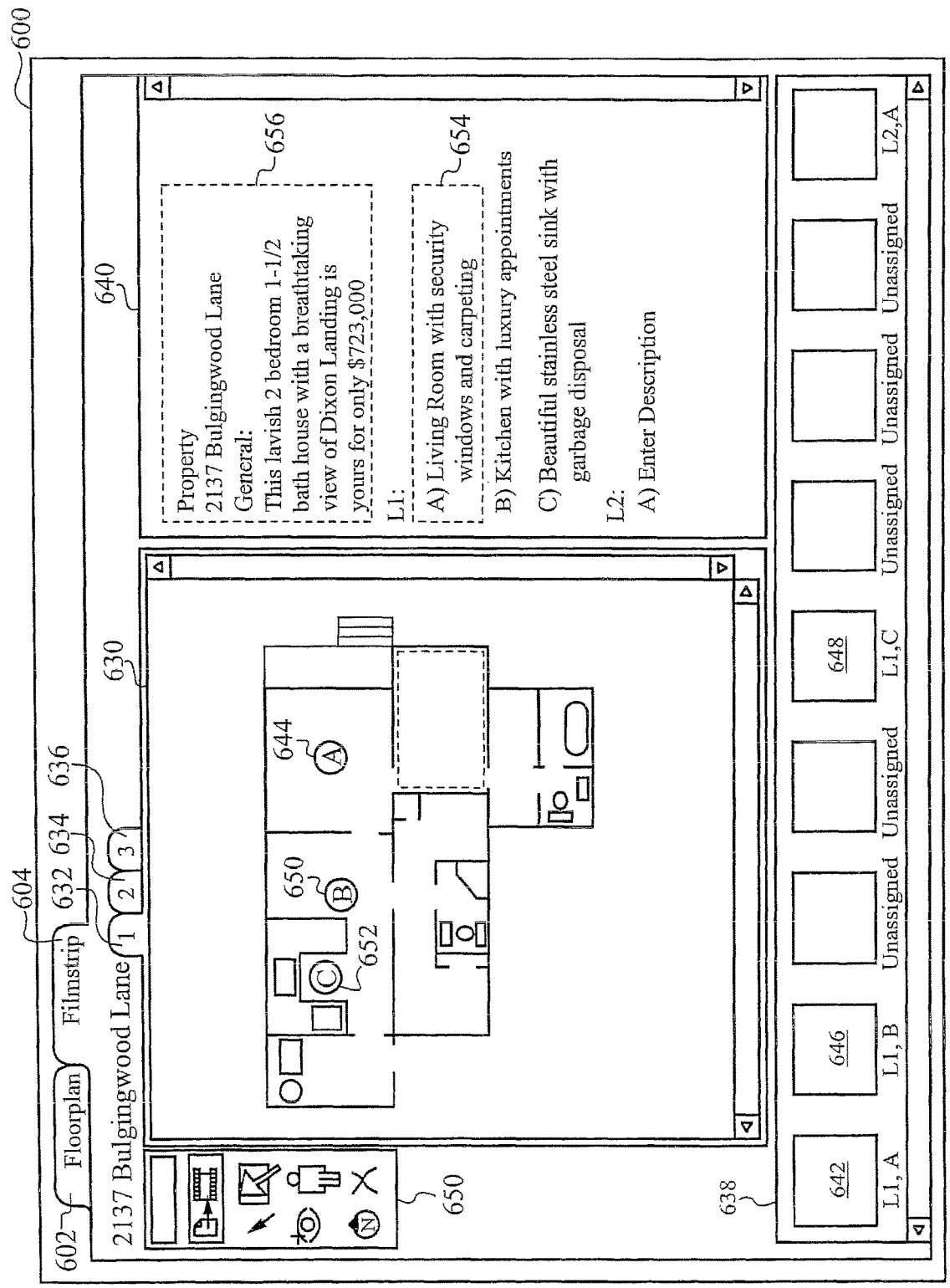
FIG. 8 illustrates a second screen of the tour construction GUI.

The interactive viewing system of the present invention includes a tour construction GUI. A tour construction GUI according to the preferred embodiment of the present invention is illustrated in FIGS. 7 and 8. FIG. 7 illustrates a first screen of the tour construction GUI, which is used to generate the schematic layout. The tour construction GUI 600 includes a floor plan drawing screen 602 and a filmstrip screen 604. Only a tab corresponding to the filmstrip 604 is shown in FIG. 7. The floor plan drawing screen 602 is used to generate a completed schematic layout. The floor plan drawing screen 602 includes a layout grid and preliminary schematic layout 606, a symbols box 614, a tools box 616, and a levels box 618. The preliminary schematic layout 606 is either initially imported from outside the interactive viewing system or is generated using a specially designed grid and notation template from within the interactive viewing system. Preferably, the grid illustrated in FIG. 7 is used as the specially designed grid and notation template.

Alternatively, a complimentary service to the interactive viewing system of the present invention generates the preliminary schematic layout. In this alternate embodiment, a user can provide to the service a rough draft sketch including an outline of the layout and keys designating specific features associated with the layout. The keys can include room designations and symbols for specific objects. Table 1.0 illustrates a sample of room designation keys. Table 2.0 illustrates a sample of symbol keys. The service receives the rough draft sketch comprising the layout and keys, and converts the rough draft into the preliminary layout.

TABLE 1.0

| KEY | ROOM DESIGNATION |
|-----|------------------|
| LR | living room |
| FM | family room |
| BK | breakfast area |
| DN | dining area |
| DE | den |
| OF | office |
| AV | audio video room |
| MB | master bedroom |
| GB | guest bedroom |
| BR | bath (not attached to bedrooms) |
| HB | half bath (not attached to bedrooms) |
| GBR | guest bath |
| MBR | master bath |
| RD | reading area/study |
| CL | closet |
| ST | storage |
| PT | pantry |
| GR | garage |
| BS | basement |
| AT | attic/loft |
| BL | balcony |
| DK | deck |
| PA | patio |
| KN | kitchen |

TABLE 2.0

| KEY | OBJECT SYMBOLS |
|-----|----------------|
| TL | toilet |
| BD | bidet |
| SH | shower |

TABLE 2.0-continued

| KEY | OBJECT SYMBOLS |
|-----|----------------|
| BT | bath |
| BS | bath sink |
| KS | kitchen sink |
| RF | refrigerator |
| DW | dishwasher |
| WS | clothes washer |
| DR | clothes dryer |
| RG | range |
| GL | grill |
| OV | oven |
| HT | hot tub |
| SP | spa |
| JZ | jacuzzi |
| FP | fireplace |
| WS | wood stove |

Each level of the preliminary schematic layout 606 are accessed using level tabs 608, 610, and 612. On each tab 608, 610, and 612, a scaled-down version of the associated floor plan for that level can be made visible. This aids in navigating to the appropriate level.

The symbols box 614 includes a library of symbols which can be added to the preliminary schematic layout 606. The library includes symbols for bathrooms, kitchens, utilities, outside yard, and the like. The tools box 616 includes tools to be used in constructing the schematic layout. These tools include select arrow, scale box, rectangle box, line tool, add/subtract wall, add/subtract window, rotate, zoom, delete object, and save file. Other tools can include sending object to another level, merge objects to form new shapes, and any other conventional drawing tools that are well known in the art. The levels box 618 includes functionality to add and delete levels, and to make each level transparent or opaque. A transparent level enables additional levels to be seen, as if using tracing paper.

FIG. 8 illustrates a second screen of the tour construction GUI, which is used to view the uploaded visual representations, associate the visual representations to specific portions of the schematic layout, and add descriptions. A filmstrip screen 604 includes a schematic layout 630, a description area 640, a filmstrip tool box 650, and an images archive 638. The schematic layout 630 corresponds to the template 606 (FIG. 7) generated in the floor plan drawing screen 602. Each level of the schematic layout 630 is accessible using the level tabs 632, 634, and 636. The filmstrip tool box 650 includes tools to be used in associating visual representations to the schematic layout. The tools include import visual representations, select arrows, add viewpoints, add details, add viewer point of view, direction of North, and delete any of the above. Other tools can include unassign a visual representation.

The images archive 638 displays all visual representations that have been imported using the import visual representations tool in the filmstrip tool box 650. Initially all imported visual representations are unassigned. A visual representation is assigned to a specific portion of the schematic layout 630 by selecting the add viewpoint icon from the filmstrip tool box 650, clicking on the desired portion of the schematic layout 630 to generate a viewpoint such as viewpoint 644, and then selecting the visual representation within the images archive 638 to be associated with viewpoint 644, such as visual representation 642. Alternatively, the user assigns each visual representation to a specific position within the schematic layout 630 using a drag and drop operation, as is well known in the art. When assigning a visual representation, a viewpoint letter or number, such as viewpoint A, is assigned to the visual representation, as well as entering a corresponding letter or number in the description area 640.

In this manner, visual representation 642 is assigned to viewpoint 644 such that during an interactive tour, the visual representation 642 is displayed in the visual representation 630 (FIG. 5) when the user navigates to the viewpoint 644. In a similar manner, visual representation 646 can be assigned to viewpoint 650 and visual representation 648 can be assigned to viewpoint 652. Other visual representations within the images archive 638 can similarly be assigned to any of the other levels within the schematic layout.

As each visual representation from the images archive 638 is assigned to a viewpoint within the schematic layout 630, the user is prompted for a corresponding text description. This text description is displayed within the description area 640. Description 654 illustrates an exemplary text description corresponding to the viewpoint 644 and the visual representation 642. Similarly, the user can add a description corresponding to the schematic layout 630. Description 656 illustrates an exemplary text description corresponding to the schematic layout 630. During an interactive tour, the description 656 is displayed in the schematic layout description 520 (FIG. 5) and the description 654 is displayed in the picture description 540 (FIG. 5) when the user navigates the viewpoint 644.

For each viewpoint 644, 650, and 652 a viewer point of view is added. The viewer point of view is preferably indicated by a current position marker and a direction indicator, such as an arrow and/or a field of view indicator. The arrow shows the user's position within the room and the direction they are facing. Further, the wall or walls that are seen within the corresponding visual representation are highlighted on the schematic layout 630. Additionally, if there are more details to be shown, such as cabinet work in a kitchen or the view from a window, the details tool is used to create a "drill down" icon to see close up images. Viewpoints can also be created to view the exterior property, and specifics such as a swimming pool, spa, or particular vistas. Further details can also be added including a pathway, such as pathway 554 in FIG. 5, which indicates the directions and available viewpoints available to the user during an interactive tour.

Although the schematic layout illustrated in FIGS. 5, 7 and 8 is represented in two dimensions, the schematic layout can also be a three dimensional representation. Also, the interactive viewing system preferably uses flash technology, a plug-in that is supplied with both major browsers, and is used by a high percentage of Internet users. Flash technology is also available as a stand-alone player, and therefore can be used as a stand-alone device, or as part of another application such as Microsoft PowerPoint. Since the interactive viewing device uses simple 2D and 3D graphics, the technology can be extended to other devices such as cellular telephones and personal digital assistants (PDAs). It should be clear to those skilled in the art that technologies other than flash can be used. For example, Virtual Reality Modeling Language (VRML), Game 3D Application Programming Interface (API), Shockwave by Macromedia, and an Active-X applet, or Java applet. The interactive viewing system of the present invention can be used in any device that enables user navigation, such as with keyboard keys, directional arrows, cursor or stylus, and a graphics capable screen. Each layout, or portions of each layout, can be indexed using metadata for use by searching applications.

In operation, a user can create an interactive tour by generating a sketch of a preliminary schematic layout. This sketch can be created outside of the interactive viewing system of the present invention and then imported, or a specially designed grid and template within the interactive viewing system can be used. Details are then added to the sketch including symbols related to appliances, utilities, yard, and staircases to link one level to another. The dimensions can also be re-scaled. Once these details are added, a template of a final schematic layout is created. All images are then uploaded, and each individual image is then associated to a specific location within the schematic layout template. Corresponding text descriptions, and a viewer's point of view are also added for each image. The schematic layout template is then saved as an interactive tour.

Advantages of the present invention include a viewing duality in which the user is shown a floor plan or other birds-eye view on one side of the screen and a photographic area on the other. As discussed above, the birds-eye view can be a static two-dimensional representation or a moving three-dimensional object that moves or rotates with the user's movements. Another advantage is the use of a user's current position and viewing perspective. The user is presented with their position on the birds-eye view at all times, and an area is highlighted on this birds-eye view showing the approximate area being viewed. Yet another advantage is the use of pathways. Pathways can be used to show not only the direction of suggested movement, but also showing the user the correct viewing perspective as the pathway is followed. For example, as the user leaves the living room and walks down the hallway towards the bedroom, the direction down the hallway is indicated by a direction indicator, which also indicates the viewing perspective of an accompanying image. As the user turns around and proceeds down the same path from the bedroom down the hallway to the living room, the direction indicator changes to represent a different viewing perspective.

The tour can also be a self-running movie, in which case the user has no interaction with the tour. Instead, the user watches the pathways and field of view highlights as a "virtual person" moves through the schematic layout.

Although the interactive viewing system of the present invention has been described in terms of an existing home, the interactive viewing system can be used to provide tours of other types of locations. These locations can be real or imaginary, that is a rendition of any contemplated design. The interactive viewing system can be used to provide tours of homes, offices, museums, any type of building, shopping malls, urban developments, or in general any type of structure, collection of structures, or area to be mapped. The interactive viewing system can also provide a sense of movement and an ability to gather visual information through spaces and environments, real or imaginary, not just structures. Examples include, but are not limited to, electrical conduits, city infrastructures, waterways, or organism anatomies such as a ventricle of a heart. In such spaces and environments, the pathways are "perceived pathways" which provide suggested direction within a given space and/or environment.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to those skilled in the art that while the preferred embodiment of the present invention is accessible over the internet through the public switched telephone network, the present invention can also be accessible using any other appropriate communication network, both wired and wireless, including cable, intranets, direct connections and the like. It will also be apparent that the present invention can be used as a stand alone application.

What is claimed is:

1. A method of electronically viewing a remote location, the method comprising:
providing a schematic layout comprising a plurality of pathways and a plurality of viewpoints, wherein a changeable current position within the schematic layout is represented by a current position marker, wherein the current position marker is able to be selected after selecting a first previous position marker or after selecting a second previous position marker, wherein the current position marker is in a first direction from the first previous position marker and in a second direction from the second previous position marker, wherein the first direction and the second direction are different, wherein only one of the current position marker, the first previous position marker and the second previous position marker are displayed at a time;
while navigating a pathway of the plurality of pathways from a first viewpoint to a second viewpoint of the plurality of viewpoints, displaying the current position marker on the pathway of the schematic layout such that a portion of the pathway is occupied by the current position marker; and
selecting and displaying one of a plurality of perspectives of a visual representation of a portion of the schematic layout corresponding to the current position marker when the current position marker is selected, the plurality of perspectives each having a different perspective direction, wherein the selection of the one of the perspectives is based on either the first previous position marker or the second previous position marker such that when the current position marker is selected after selecting the first previous position marker, the perspective direction of the one of the perspectives that is selected and displayed is in the first direction, whereas when the current position marker is selected after selecting the second previous position marker, the perspective direction of the one of the perspectives that is selected and displayed is in the second direction.

2. The method according to claim 1 wherein the current position marker represents a position from which the visual representation is made, and further comprises a directional indicator which indicates a perspective angle of the visual representation.

3. The method according to claim 2 wherein a portion of the schematic layout corresponding to the visual representation is highlighted.

4. The method according to claim 1 wherein the current position marker represents a position to which the visual representation is made and further comprises a directional indicator which indicates a perspective angle from which the visual representation is made.

5. The method according to claim 1 wherein the schematic layout represents a physical location that is real or imaginary.

6. The method according to claim 1 wherein the schematic layout and the visual representation are viewed side-by-side.

7. The method according to claim 1 wherein navigating the schematic layout is accomplished by following a suggested movement along the pathway within the schematic layout.

8. The method according to claim 1 wherein the schematic layout comprises one or more levels.

9. The method according to claim 8 wherein each level is a two-dimensional representation.

10. The method according to claim 8 wherein each level is a three-dimensional representation.

11. The method according to claim 8 wherein one level is displayed on the schematic layout at a time.

12. The method according to claim 11 wherein each level is transparent, semi-transparent, or opaque.

13. The method according to claim 8 wherein more than one level is displayed on the schematic layout at the same time.

14. The method according to claim 1 wherein the schematic layout is navigated using a user interface which includes a keyboard, a mouse, or a touch-sensitive display.

15. The method according to claim 1 wherein the visual representation is an image, video, or graphic content.

16. The method according to claim 15 wherein the visual representation is a digital photograph.

17. The method according to claim 1 wherein flash technology is used to display the schematic layout and the visual representation.

18. The method according to claim 1 wherein the schematic layout represents a physical location that represents an object or an environment.

19. The method of according to claim 1 wherein the current position marker includes a means for indicating additional functionality.

20. The method according to claim 19 wherein the additional functionality includes a link to a related schematic layout or a link to a related visual representation.

21. The method according to claim 19 wherein the additional functionality includes a link to an interactive visual representation.

22. An apparatus for providing an interactive tour, the apparatus comprising:
a user interface to navigate a schematic layout comprising a plurality of pathways and a plurality of viewpoints, wherein a current position within the schematic layout is represented by a changeable current position marker, wherein the current position marker is able to be selected after selecting a first previous position marker or after selecting a second previous position marker, wherein the current position marker is in a first direction from the first previous position marker and in a second direction from the second previous position marker, wherein the first direction and the second direction are different, wherein only one of the current position marker, the first previous position marker and the second previous position marker are displayed at a time;
while navigating a pathway of the plurality of pathways from a first viewpoint to a second viewpoint of the plurality of viewpoints, displaying the current position marker on the pathway of the schematic layout such that a portion of the pathway is occupied by the current position marker; and
a display device coupled to the user interface to display the schematic layout and one of a plurality of perspectives of a visual representation of a portion of the schematic layout corresponding to the current position marker when the current position marker is selected, the plurality of perspectives each having a different perspective direction, wherein the selection of the one of the perspectives is based on either the first previous position marker or the second previous position marker such that when the current position marker is selected after selecting the first previous position marker, the perspective direction of the one of the perspectives that is selected and displayed is in the first direction, whereas when the current position marker is selected after selecting the second previous position marker, the perspective direction of the one of the perspectives that is selected and displayed is in the second direction.

23. The apparatus according to claim 22 wherein the current position marker represents a position from which the visual representation is made, and further comprises a directional indicator which indicates a perspective angle of the visual representation.

24. The apparatus according to claim 23 wherein a portion of the schematic layout corresponding to the visual representation is highlighted.

25. The apparatus according to claim 22 wherein the current position marker represents a position to which the visual representation is made and further comprises a directional indicator which indicates a perspective angle from which the visual representation is made.

26. The apparatus according to claim 22 wherein the schematic layout represents a physical location that is real or imaginary.

27. The apparatus according to claim 22 wherein the schematic layout and the visual representation are viewed side-by-side.

28. The apparatus according to claim 22 wherein the schematic layout further comprises the pathway to provide a suggested movement while navigating the schematic layout.

29. The apparatus according to claim 22 wherein the schematic layout comprises one or more levels.

30. The apparatus according to claim 29 wherein each level is a two-dimensional representation.

31. The apparatus according to claim 29 wherein each level is a three-dimensional representation.

32. The apparatus according to claim 29 wherein one level is displayed on the schematic layout at a time.

33. The apparatus according to claim 32 wherein each level is transparent, semi-transparent, or opaque.

34. The apparatus according to claim 29 wherein more than one level is displayed on the schematic layout at the same time.

35. The apparatus according to claim 22 wherein the user interface includes a keyboard, a mouse, or a touch-sensitive display.

36. The apparatus according to claim 22 wherein the visual representation is an image, video, or graphic content.

37. The apparatus according to claim 36 wherein the visual representation is a digital photograph.

38. The apparatus according to claim 22 wherein flash technology is used to display the schematic layout and the visual representation.

39. The apparatus according to claim 22 wherein the schematic layout represents a physical location that represents an object or an environment.

40. The apparatus of according to claim 22 wherein the current position marker includes a means for indicating additional functionality.

41. The apparatus according to claim 40 wherein the additional functionality includes a link to a related schematic layout or a link to a related visual representation.

42. The apparatus according to claim 40 wherein the additional functionality includes a link to an interactive visual representation.

43. A network of devices to provide an interactive tour, the network of devices comprising:
one or more computer systems comprising one or more processors configured to communicate with other systems; and
an interactive viewing system configured to;
couple to the one or more computer systems to navigate a schematic layout comprising a plurality of pathways and a plurality of viewpoints, wherein a changeable current position within the schematic layout is represented by a current position marker, wherein the current position marker is able to be selected after selecting a first previous position marker or after selecting a second previous position marker, wherein the current position marker is in a first direction from the first previous position marker and in a second direction from the second previous position marker, wherein the first direction and the second direction are different, wherein only one of the current position marker, the first previous position marker and the second previous position marker are displayed at a time,
while navigating a pathway of the plurality of pathways from a first viewpoint to a second viewpoint of the plurality of viewpoints, displaying the current position marker on the pathway of the schematic layout such that a portion of the pathway is occupied by the current position marker; and
display the schematic layout and one of a plurality of perspectives of a visual representation of a portion of the schematic layout corresponding to the current position marker when the current position marker is selected, the plurality of perspectives each having a different perspective direction, wherein the selection of the one of the perspectives is based on either the first previous position marker or the second previous position marker such that when the current position marker is selected after selecting the first previous position marker, the perspective direction of the one of the perspectives that is selected and displayed is in the first direction, whereas when the current position marker is selected after selecting the second previous position marker, the perspective direction of the one of the perspectives that is selected and displayed is in the second direction.

44. The network of devices according to claim 43 wherein the current position marker represents a position from which the visual representation is made, and further comprises a directional indicator which indicates a perspective angle of the visual representation.

45. The network of devices according to claim 42 wherein a portion of the schematic layout corresponding to the visual representation is highlighted.

46. The network of devices according to claim 43 wherein the current position marker represents a position to which the visual representation is made and further comprises a directional indicator which indicates a perspective angle from which the visual representation is made.

47. The network of devices according to claim 43 wherein the schematic layout represents a physical location that is real or imaginary.

48. The network of devices according to claim 43 wherein the schematic layout and the visual representation are viewed side-by-side.

49. The network of devices according to claim 43 wherein the schematic layout further comprises the pathway to provide a suggested movement while navigating the schematic layout.

50. The network of devices according to claim 43 wherein the schematic layout comprises one or more levels.

51. The network of devices according to claim 50 wherein each level is a two-dimensional representation.

52. The network of devices according to claim 50 wherein each level is a three-dimensional representation.

53. The network of devices according to claim 50 wherein one level is displayed on the schematic layout at a time.

54. The network of devices according to claim 53 wherein each level is transparent, semi-transparent, or opaque.

55. The network of devices according to claim 53 wherein more than one level is displayed on the schematic layout at the same time.

56. The network of devices according to claim 43 wherein the user interface includes a keyboard, a mouse, or a touch-sensitive display.

57. The network of devices according to claim 43 wherein the visual representation is an image, video, or graphic content.

58. The network of devices according to claim 57 wherein the visual representation is a digital photograph.

59. The network of devices according to claim 43 wherein flash technology is used to display the schematic layout and the visual representation.

60. The network of devices according to claim 43 wherein the one or more computer systems and the interactive viewing system are coupled via the Internet.

61. The network of devices according to claim 43 wherein the interactive viewing system resides within a personal computer, a personal digital assistant (PDA), or a cellular phone.

62. The network of devices according to claim 43 wherein the schematic layout represents a physical location that represents an object or an environment.

63. The network of devices of according to claim 43 wherein the current position marker includes a means for indicating additional functionality.

64. The network of devices according to claim 63 wherein the additional functionality includes a link to a related schematic layout or a link to a related visual representation.

65. The network of devices according to claim 63 wherein the additional functionality includes a link to an interactive visual representation.

* * * * *